US011737550B2

(12) United States Patent
Williamson et al.

(10) Patent No.: US 11,737,550 B2
(45) Date of Patent: Aug. 29, 2023

(54) ATTACHMENT SYSTEM FOR PORTABLE COMMUNICATION DEVICE

(71) Applicant: Loose Cannon Systems, Inc., Ross, CA (US)

(72) Inventors: Timothy Williamson, London (GB); Robert Wilson, London (GB); Maximilian Wozniak, Carshalton (GB)

(73) Assignee: Loose Cannon Systems, Inc., Ross, CA (US)

( * ) Notice: Subject to any disclaimer, the term of this patent is extended or adjusted under 35 U.S.C. 154(b) by 107 days.

(21) Appl. No.: 17/369,428

(22) Filed: Jul. 7, 2021

(65) Prior Publication Data

US 2022/0007820 A1 Jan. 13, 2022

Related U.S. Application Data

(60) Provisional application No. 63/050,085, filed on Jul. 9, 2020.

(51) Int. Cl.
*A45F 5/00* (2006.01)
*F16B 1/00* (2006.01)
*H05K 5/02* (2006.01)

(52) U.S. Cl.
CPC ............... *A45F 5/00* (2013.01); *F16B 1/00* (2013.01); *A45F 2005/008* (2013.01); *A45F 2200/0508* (2013.01); *A45F 2200/0516* (2013.01); *A45F 2200/0533* (2013.01); *F16B 2001/0035* (2013.01); *H05K 5/0204* (2013.01)

(58) Field of Classification Search
CPC .............. A45F 5/00; A45F 2005/008; A45F 2200/0516; A45F 5/02; F16B 2001/0035
See application file for complete search history.

(56) References Cited

U.S. PATENT DOCUMENTS

| | | | | |
|---|---|---|---|---|
| 5,196,818 A | * | 3/1993 | Anderson | A45F 5/00 224/183 |
| 5,333,767 A | * | 8/1994 | Anderson | H01F 7/0252 224/267 |
| 7,337,903 B2 | * | 3/2008 | Lauri | A45F 5/02 206/352 |
| 8,936,222 B1 | * | 1/2015 | Bastian | A45F 5/00 224/183 |
| 9,397,719 B1 | * | 7/2016 | Schmidt | F16M 11/24 |
| 9,605,696 B1 | * | 3/2017 | May | H01F 7/0263 |
| 9,706,829 B2 | * | 7/2017 | Tilney | A45F 5/00 |
| 9,800,283 B2 | * | 10/2017 | Schmidt | H04M 1/04 |
| 9,954,569 B2 | * | 4/2018 | Murphy | F16M 11/40 |
| 2007/0087794 A1 | * | 4/2007 | Choi | A45F 5/02 455/575.6 |

(Continued)

*Primary Examiner* — Robert Sandy
*Assistant Examiner* — Louis A Mercado

(57) ABSTRACT

An attachment system for a portable electronic device includes a clip unit including a clip magnet disposed between a base plate and a top cover and a clip lip formed on the top cover; and an attachment adapter for attached to a back side of the base plate and configured for attachment of the clip unit to an article. The clip magnet is positioned to be aligned with a magnet in the portable electronic device when mated with the portable electronic device. The attachment system enables the portable electronic device to be quickly and easily attached to a desired article and further enable quick release of the portable electronic device from the attachment system.

17 Claims, 13 Drawing Sheets

(56) References Cited

U.S. PATENT DOCUMENTS

2013/0331153 A1* 12/2013 Krimstock .......... H04M 1/6041
　　　　　　　　　　　　　　　　　　　　455/569.1
2020/0127694 A1* 4/2020 Lim .................... H04B 1/3877

* cited by examiner

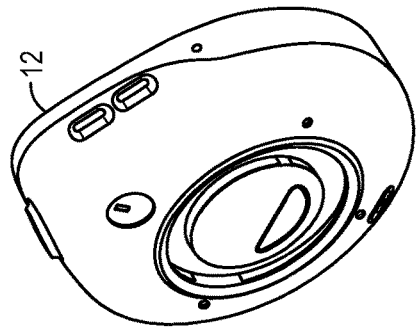
FIG. 1(a)
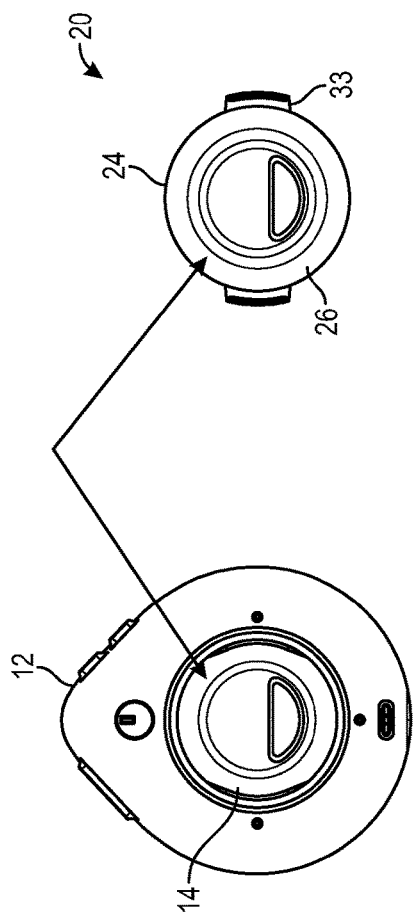
FIG. 1(b)
FIG. 1(c)
FIG. 1
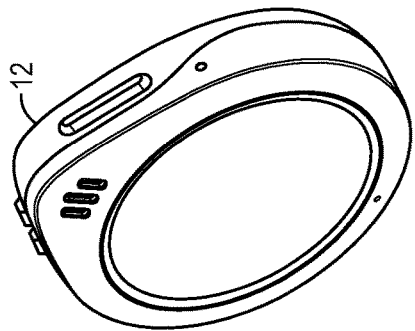

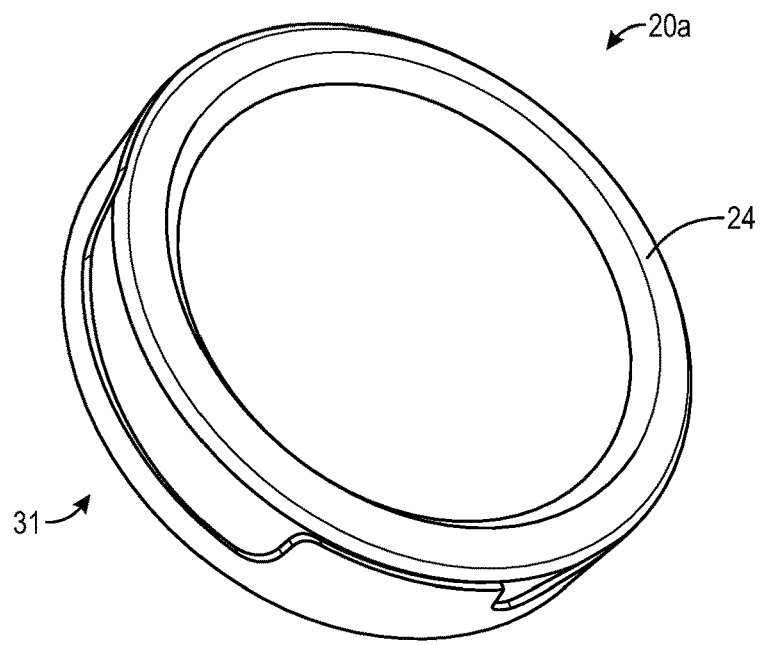
FIG. 2(a)
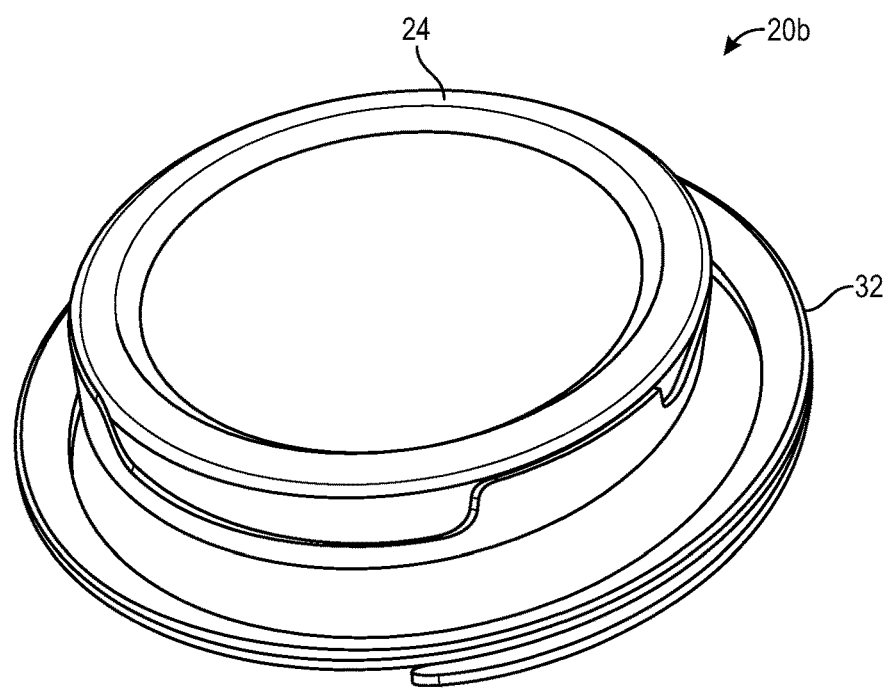
FIG. 2(b)
FIG. 2

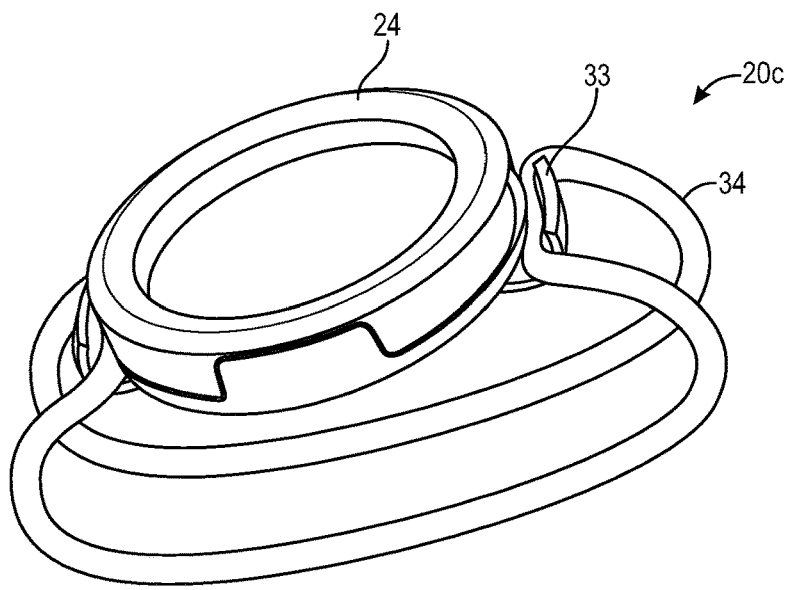
FIG. 2(c)
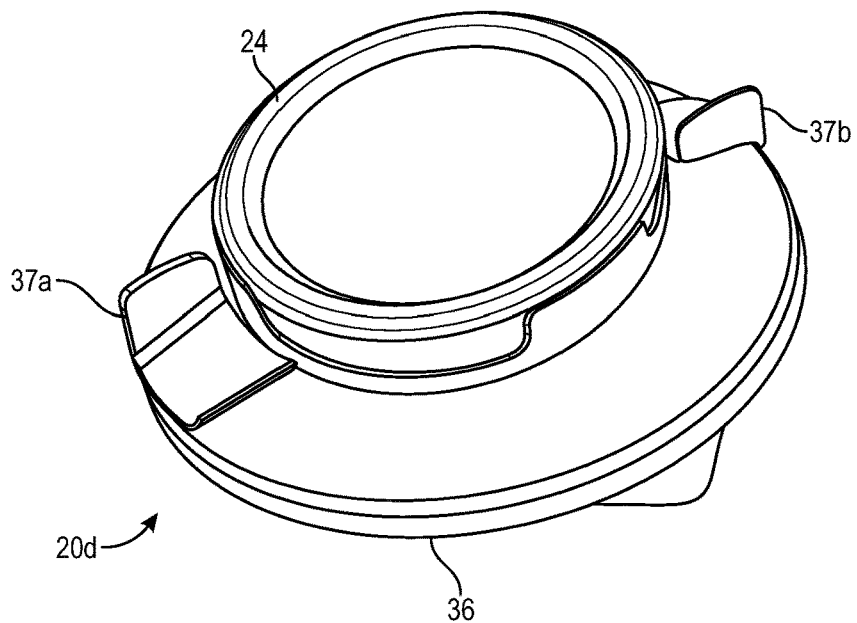
FIG. 2(d)
FIG. 2
(Continued)

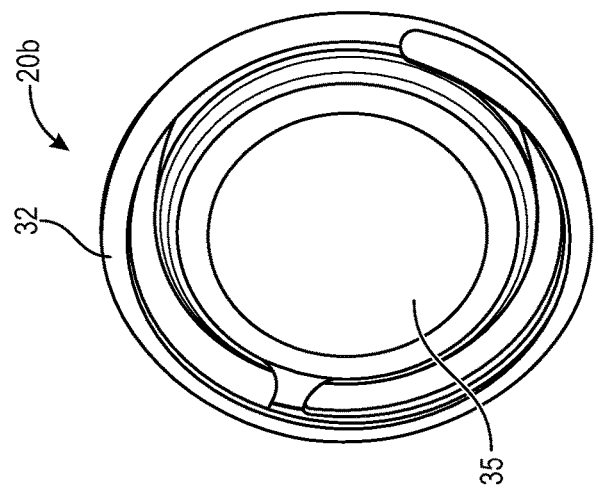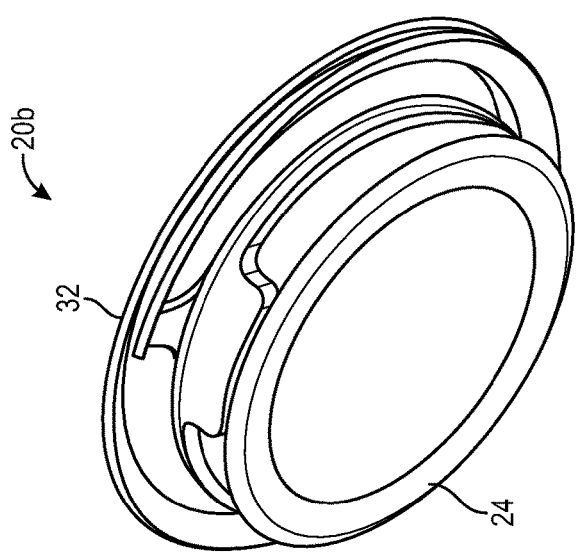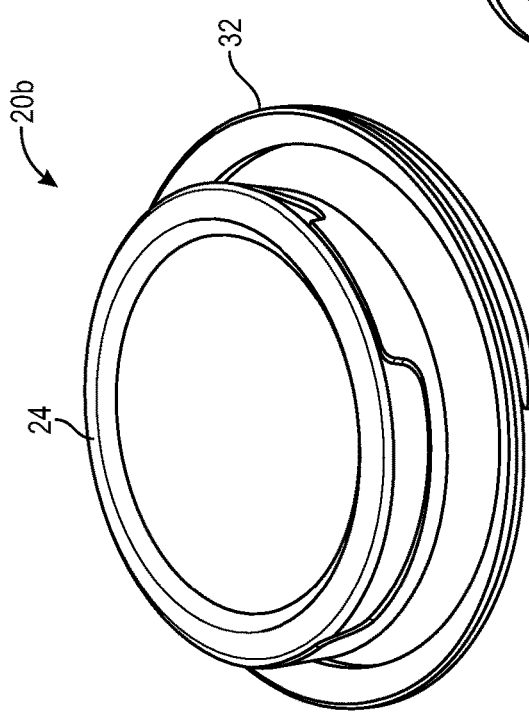
FIG.3(a)
FIG.3(c)
FIG.3(b)
FIG. 3

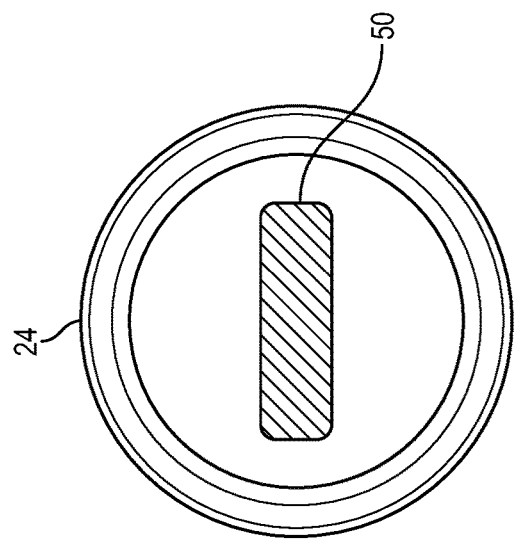
FIG. 4(b)
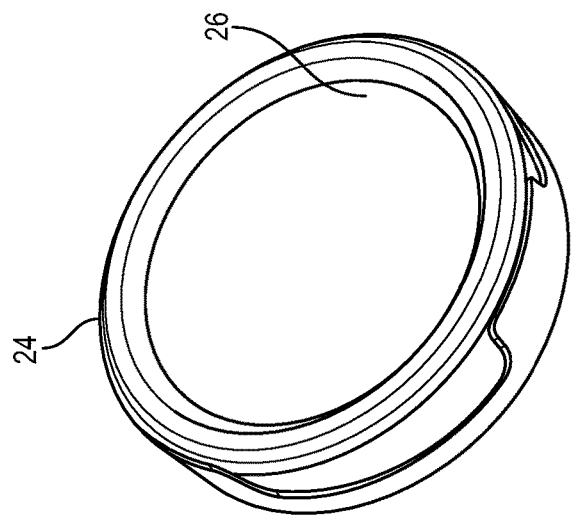
FIG. 4(c)
FIG. 4
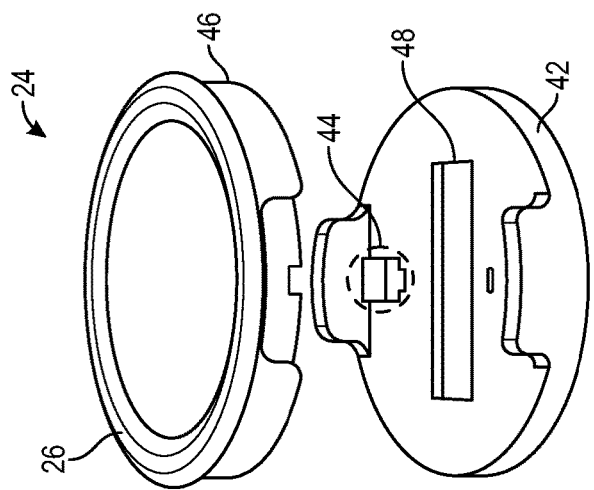
FIG. 4(a)

ATTACHMENT SYSTEM FOR PORTABLE COMMUNICATION DEVICE

CROSS REFERENCE TO RELATED APPLICATIONS

This application claims priority to U.S. Provisional Patent Application No. 63/050,085, entitled ATTACHMENT SYSTEM FOR PORTABLE COMMUNICATION DEVICE, filed Jul. 9, 2020, which is incorporated herein by reference for all purposes.

FIELD OF THE INVENTION

The invention relates to an attachment system and mechanism for a portable electronic device and, in particular, to an attachment system and mechanism for secure mounting and quick release of a portable electronic device.

BACKGROUND OF THE INVENTION

Portable electronic devices include consumer products such as mobile phones, cameras, personal speakers and personal communication devices. For example, portable personal communication devices are becoming increasingly ubiquitous in everyday communication. For convenience, portable electronic devices are often attached or mounted to the users' garments, or on arm bands, or on objects carried by the users, such as the strap of a backpack. Portable electronic devices may also be attached or mounted to a users' equipment such as the handlebars of a bike.

BRIEF DESCRIPTION OF THE DRAWINGS

Various embodiments of the invention are disclosed in the following detailed description and the accompanying drawings.

FIG. 1, which includes FIGS. 1(a), 1(b) and 1(c), illustrates the application of the attachment system to a main unit in embodiments of the present invention.

FIG. 2, which includes FIGS. 2(a) to 2(e), illustrates several embodiments of the attachment system including a clip unit coupled to a variety of attachment adapters.

FIG. 3, which includes 3(a), 3(b) and 3(c), illustrates the attachment system configured as a pocket clip in some embodiments.

FIG. 4, which includes FIGS. 4(a) to 4(c), illustrates the construction of the clip unit of the attachment system in some embodiments.

FIG. 6, which includes

FIG. 9, which includes

DETAILED DESCRIPTION

Figures 2, 2E:
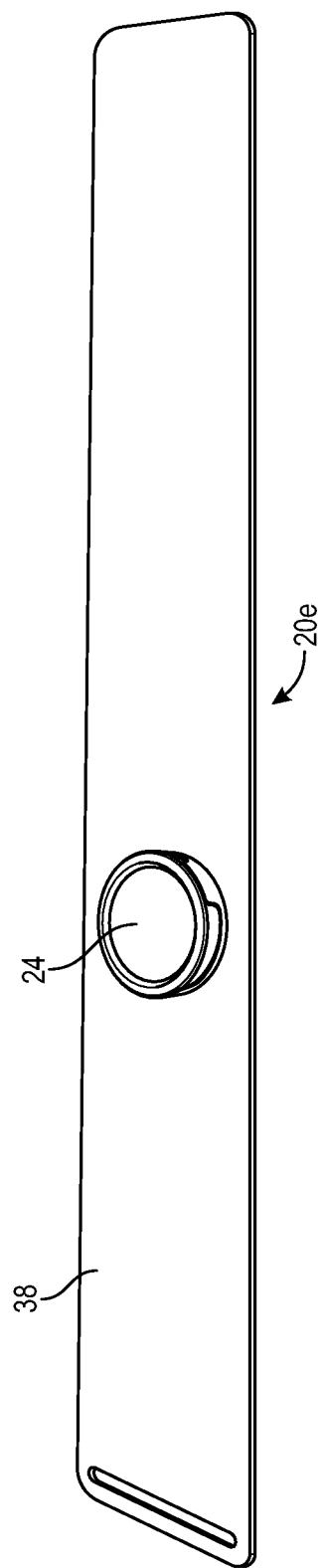

In embodiments of the present disclosure, an attachment system and mechanism for attaching to a portable electronic device uses the alignment of magnets to engage or disengage the portable electronic device to or from the attachment system. The attachment system enables a portable electronic device to be quickly and easily attached to a desired article and further enable quick release of the portable electronic device from the attachment system.

In embodiments of the present disclosure, the portable electronic device is a wearable device, such as a wearable personal communication device. In some embodiments, the portable electronic device is a mobile phone or a two-way radio, such as a walkie talkie. In further embodiments, the portable electronic device is a portable communication device described in U.S. Pat. No. 10,237,317 or U.S. Pat. No. 10,003,625, which patents are incorporated herein by reference in their entireties.

In some embodiments, the attachment system is implemented as a clip system including a clip unit combined or incorporated with an attachment adapter. The clip unit includes an undercut feature which mates to a corresponding lip on the portable communication device to securely attach the portable communication device to the clip unit. The attachment adapter enables attachment of the clip unit to a desired article.

FIG. 1, which includes FIGS. 1(a), 1(b) and 1(c), illustrates the application of the attachment system to a main unit in embodiments of the present invention. FIG. 1(a) illustrates a front perspective view of a main unit 12 which is a portable electronic device in the present example. FIG. 1(b) illustrates a rear perspective view of the main unit 12. In particular, in the present example, the main unit 12 is a portable communication device, such as the portable communication device described in the aforementioned '317 and '625 Patents. FIG. 1(c) illustrates an attachment system 20 being configured for attachment to the main unit 12. The attachment system 20 includes a clip unit 24 that is configured to mate with the main unit 12 to enable the main unit to be attached to a desired article. In the present embodiment, the clip unit 24 is in the shape of a circular disk with a clip lip 26 having an undercut feature to engage with a corresponding lip 14 formed on the main unit 12. Furthermore, the main unit 12 and the clip unit 24 each includes a magnet to facilitate engagement and disengagement of the main unit to the clip unit, as will be described in more details below.

In the front view shown in FIG. 1(c), the attachment system 20 includes a bracket 33 attached to the clip unit 24. The bracket 33 can be used to enable attachment of the clip unit to various articles, as will be described in more detail below. In particular, the bracket 33 illustrates one example of an attachment adapter which can be provided with the clip unit 24. The bracket 33 is illustrative only and not intended to be limiting. Other attachment adapters can be used with the clip unit 24 as explained below.

In the present description, the terms "front" and "back" of the main unit and the clip unit are used to refer to opposing surfaces of the respective main unit and the clip unit for the purpose of engaging and disengaging the main unit and the clip unit. It should be understood that references to the "front" or "back" of the main unit and the clip unit are used merely as a convenient method of referring to the surfaces of the two units and are not intended to designate any surfaces as front or back. As used in the present description, the back or back surface of the main unit is the surface for engaging with the clip unit and the front or front surface of the clip unit is the surface for engaging the main unit.

FIG. 2, which includes FIGS. 2(a) to 2(e), illustrates several embodiments of the attachment system including a clip unit coupled to a variety of attachment adapters. Referring to FIG. 2, the clip unit 24 of the attachment system 20 can be applied for use with a variety of attachment adapters 31-38. In the example shown in FIG. 2(a), an attachment system 20a includes the clip unit 24 being provided with an adhesive layer 31 formed on the back of the clip unit 24 to form a stick-on clip. In the example shown in FIG. 2(b), the attachment system 20b includes the clip unit 24 being attached to a helical ring 32 to function as a pocket clip. The helical ring 32 enables attachment of the clip unit 24 to a pocket of a garment. The helical ring 32 will be descried in more detail below.

In the example shown in FIG. 2(c), the attachment system 20c includes the clip unit 24 being attached to a bracket 33 with metal arms along a diameter of the clip unit and an elastic band 34 secured to the bracket 33 to function as a strap clip. The bracket 33 and the elastic band 34 enables attachment of the clip unit 24 to a strap, such as the strap of a backpack, or to the wrist of a user.

In the example shown in FIG. 2(d), the attachment system 20d includes the clip unit 24 being attached to a rotation lock unit 36. The rotation lock unit 36 includes a pair of metal arms 37a and 37b to define an amount of rotation of the clip unit 24. The metal arms 37a and 37b are locked in place by elastic locks or elastic bands. The elastic bands can also function as bands to attach the clip unit 24 to an article, such as a wrist of a user. In other examples, the rotation lock unit 36 of the attachment system 20d can be attached to a mount which can be adapted to mount to various device holders. For example, the rotation lock unit 36 can be attached to a tripod mount. In the example shown in FIG. 2(e), the attachment system 20e includes the clip unit 24 being attached to a band 38, such as an arm band. For example, an arm band 38 may include a built-in clip unit 24, either sewn into the textile or adhered to the textile. In some embodiments, the arm band can be made of welded textile and may include rigid components for the loop and fasten areas.

In other embodiments, the attachment system may be configured to function as a clasp, a holster or a mount. One of ordinary skill in the art would appreciate that the clip unit can be coupled to a variety of attachment adapter to facilitate quick engagement and release in a wide variety of applications.

FIG. 3, which includes 3(a), 3(b) and 3(c), illustrates the attachment system configured as a pocket clip in some embodiments. More specifically, FIG. 3(a) is a front perspective view, FIG. 3(b) is a rear perspective view and FIG. 3(c) is a top perspective view of the attachment system 20b configured as a pocket clip in some embodiments. Referring to FIGS. 3(a) to 3(c), the attachment system 20b is formed by the clip unit 24 attached to a helical ring 32 where the helical ring 32 engages fabrics of a pocket to enable the attachment system 20b to function as a pocket clip. The helical ring 32 allows the attachment system 20b to be positioned into horizontal pockets and left and right hand vertical pockets. As thus configured, the pocket clip attachment system 20b can be applied to various styles of pockets, including zippered pockets. The pocket clip attachment system 20b can be used even when the zipper is almost fully closed. Furthermore, in some embodiments, the outer surface of the bottom cover of the clip unit 24 incorporates a rubber pad 35 to increase the grip of the attachment system 20b onto clothing.

In the present embodiment, the helical ring 32 includes a metal winding having one and a half circle turn in a helical manner. The metal winding including an open end to be inserted into a pocket of an article. The helical ring 32 is attached to a pocket by slipping the pocket into the open end of the helical ring and turning the helical ring to allow the pocket to be secured by the winding of the helical ring.

FIG. 4, which includes FIGS. 4(a) to 4(c), illustrates the construction of the clip unit of the attachment system in some embodiments. More specifically, FIG. 4(a) is an exploded view of the clip unit, FIG. 4(b) illustrates the magnet placement in the clip unit and FIG. 4(c) is a front perspective view of the clip unit in some embodiments. Referring to FIGS. 4(a) to 4(c), the clip unit 24 of the attachment system includes a top cover 46 and a base plate 42 attached together, such as by a snap fit assembly 44. A clip magnet 20 is placed between the top cover 46 and the base plate 42. In the present embodiment, a clip magnet cavity 48 is provided in the base plate 42 to receive the clip magnet 20. The clip magnet cavity 48 is optional and may be omitted in other embodiments. As assembled, the clip magnet 50 may be positioned parallel to a first axis of the clip unit 24, as shown in FIG. 4(b). For example, the first axis can be a horizontal axis. The placement and orientation of the clip magnet 50 correspond to the main unit magnet in the main unit so that the clip magnet 50 and the main unit magnet engage each other for attachment.

In one embodiment, the clip magnet 50 is formed of a one-piece magnetic material. In other embodiments, the clip magnet 50 may be formed using a set of small magnets. The type of magnetic material is selected to realize the desired torque and release force for the clip unit 24 of the attachment system.

Referring to FIG. 4(c), in embodiments of the present invention, the clip unit 24 includes an undercut feature formed by the clip lip 26 in the top cover 46. The undercut feature enables the clip unit 24 to mate securely with the corresponding lip feature on the main unit, as will be described in more detail below.

Figure 5:
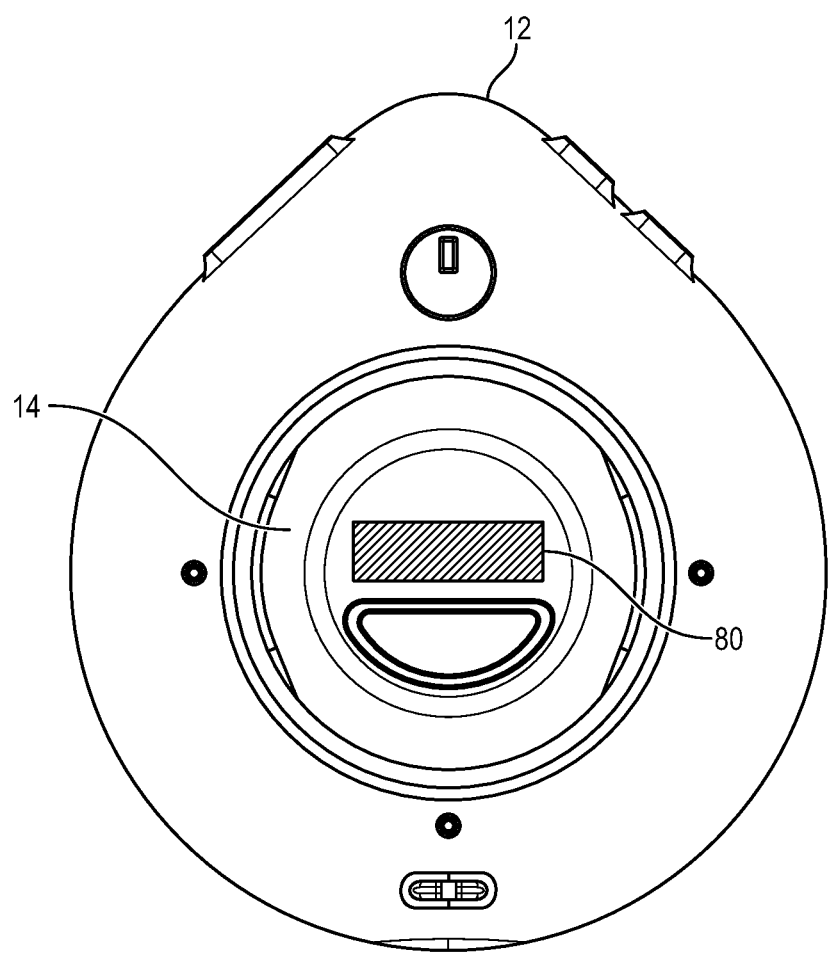
FIG. 5 is a rear view of a main unit illustrating the placement of the main unit magnet in embodiments of the present invention.

FIG. 5 is a rear view of a main unit illustrating the placement of the main unit magnet in embodiments of the present invention. Referring to FIG. 5, the main unit 12 includes a main unit magnet 80 positioned inside the main unit lip 14. In the present example, the main unit magnet 80 is placed under a back cover of the main unit and not exposed. The orientation of the main unit magnet 80 is selected so that magnet 80 will be in alignment with the clip magnet 50 (FIG. 4) when mated with the clip unit. For example, the main unit magnet 80 is positioned within the circumference defined by the lip 14 and is oriented in a horizontal position. When mated with the clip unit 24, the main unit magnet 80 and the clip magnet 50 are positioned across each other in their respective units to form the secured engagement. The main unit magnet 80 can be a one-piece magnet or a set of small magnets to provide the desired torque and release force. In some embodiments, the magnet 80 of the main unit 12 is positioned with an offset relative to the clip magnet 50. In this manner, when the main unit 12 is to be attached to the clip unit 24, the clip lip 26 of the clip unit 24 shifts or slides under the main unit lip 14 for the magnets on the two units to engage to form the secured engagement. Alternately, the clip magnet 50 on the clip unit 24 may be positioned with an offset relative to the magnet 80 of the main unit 12 to effectuate the sliding effect for engagement with the main unit 12.

Figure 6A:
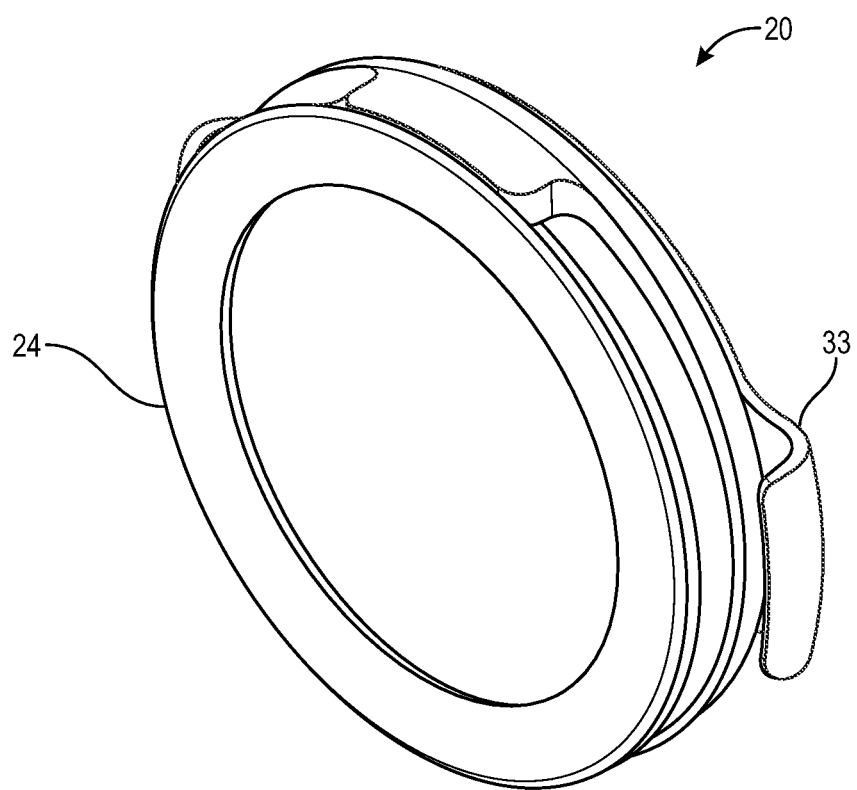
FIGS. 6(a) and 6(b), illustrates an attachment system and constructure thereof in embodiments of the present invention.
Figure 6B:
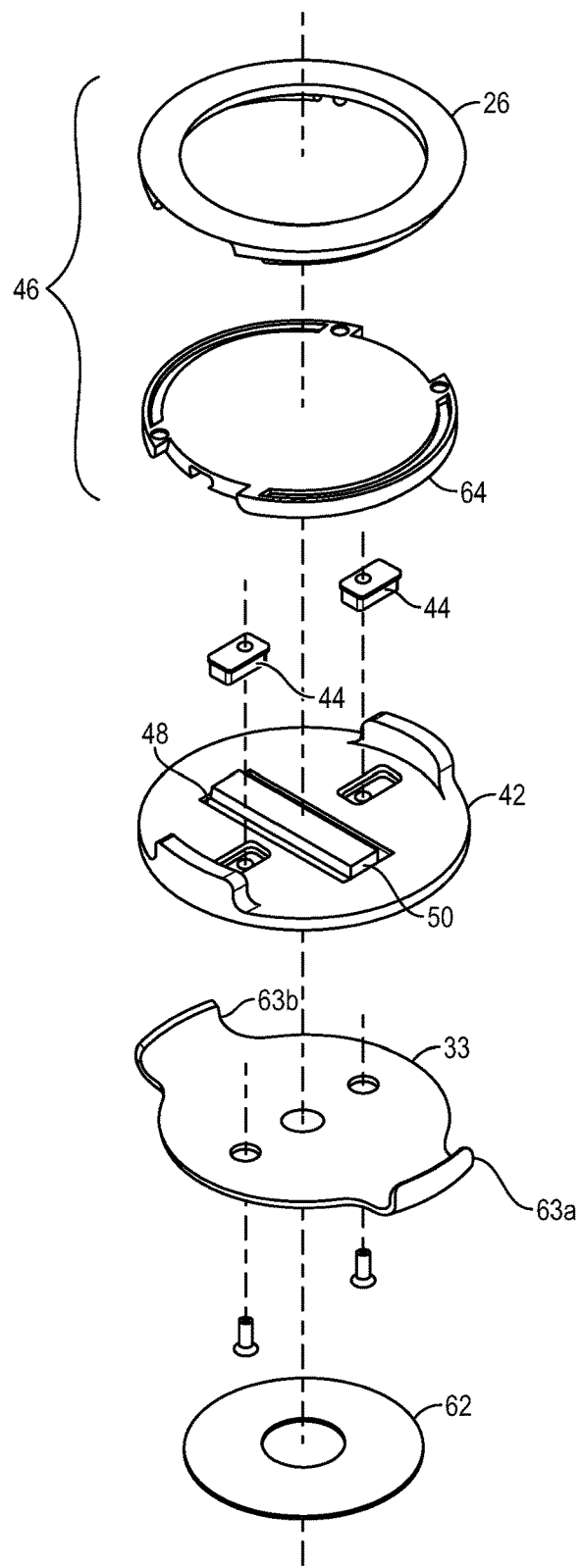

FIG. 6, which includes FIGS. 6(a) and 6(b), illustrates an attachment system and constructure thereof in embodiments of the present invention. More specifically, FIG. 6(a) is a front perspective view of an assembled attachment system 20 and FIG. 6(b) is an exploded view of the attachment system. In the example shown in FIG. 6(a), the attachment system 20 includes the clip unit 24 attached to a bracket 33, similar to the attachment system 20c shown in FIG. 2(c). An elastic band or other fastening elements can be attached or coupled to the bracket 33 to configure the attachment system 20 for various application.

Referring to FIG. 6(b), the clip unit 24 includes a base plate 42 provided with a clip magnet 50 positioned in a clip magnet cavity 48 in the present embodiment. The clip magnet cavity 48 facilitates the alignment and positioning of the clip magnet 50 but is optional and may be omitted in other embodiments. The bracket 33 is attached to the bottom or back-side of the base plate 42 through fasteners and a bottom plate 62. The bracket 33 includes arm portions 63a and 64b provided on opposite sides of a central axis of the bracket. Each of the arm portions 63a and 63b includes a curved portion to allow attachment of fastening elements, such as an elastic band. The clip unit 24 further includes elements for forming the snap fit assembly 44 and a top cover 46 formed by a cover plate 64 and a clip lip 26. The clip lip 26 is attached to the cover plate 64 to form the undercut feature of the clip unit 24. In one embodiment, the base plate 42, the cover plate 64 and the clip lip 26 are made of plastic material and the bracket 33 is made of a metal material.

As thus configured, the clip magnet 50 is disposed between the top cover 46 and the base plate 42. The clip lip 26 is used to shift and lock the clip unit 24 under the main unit lip 14 on the main unit 12. As described above and shown in FIG. 5, the main unit 12 includes the main unit lip 14 to engage with the clip lip 26. In operation, the clip lip 26 slides in engagement with the main unit lip 14 until the clip magnet 50 and the main unit magnet 80 are aligned. As the clip lip 26 slides in engagement with the main unit lip 14, the main unit lip 14 of the main unit 12 also slides under the clip lip 26 of the clip unit 24. In this manner, a "locking" mechanism is realized between the two units which is instrumental to guarantee that the clip unit 24 does not get easily pried out of the main unit 12. In other words, the clip lip 26 slides under the main unit lip 14 and the main unit lip 14 slides under the clip lip 26, resulting in locking of the clip unit to the main unit.

In particular, the sliding action is automatic when the main unit 12 engages the clip unit 24 and is a result of the main unit magnet 80 and the clip magnet 50 acting to align with each other. With the clip magnet 50 and the main unit magnet 80 aligned in parallel, the two magnets have a strong pull force, such as greater than 2 Kg. The main unit 12 is thereby secured to the clip unit 24. When the main unit 12 is rotated greater than N degrees, the clip magnet 50 and the main unit magnet 80 experience the greater than N degrees orientation with respect to each other and the pull force between the two magnets decreases to a weak level, such as 10% of the pull force or less than 200 g. In this manner, the main unit 12 can be separated from the clip unit 24 with ease. In some embodiments, the main unit 12 is rotated by a given amount, such as 60 degrees, to cause the pull force between the main unit magnet 80 and the clip magnet 50 to decrease to the desired level for disengagement.

Figure 7:
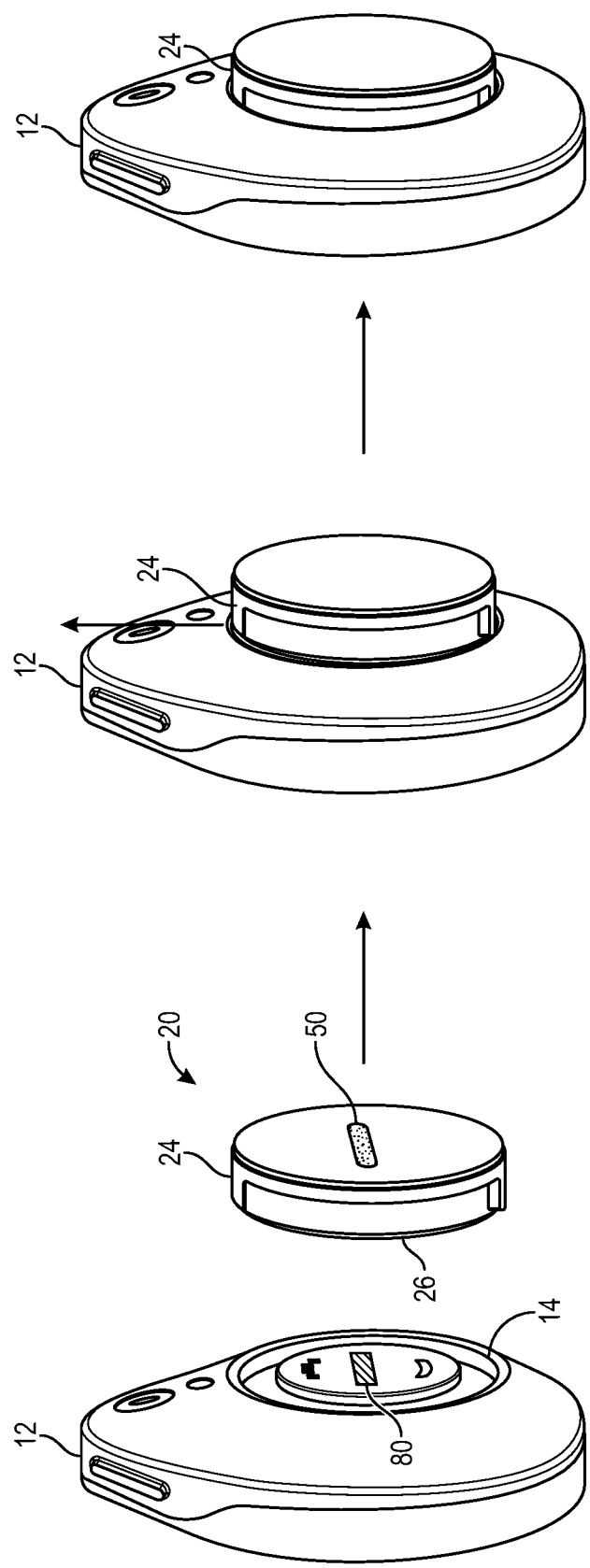
FIG. 7 illustrates the attachment mechanism of the attachment system in embodiments of the present invention.

FIG. 7 illustrates the attachment mechanism of the attachment system in embodiments of the present invention. In the present description, the attachment system is described as being used to attach to a main unit where the main unit is a portable electronic device. In the present example, the main unit is a portable communication device. Using a portable communication device as the main unit is illustrative only and is not intended to be limiting. The attachment system and attachment mechanism in embodiments of the present invention can be applied to other devices to be used as the main unit. Furthermore, to allow greater clarity in the illustrations, the present description sometimes illustrates the attachment system as a stick-on clip including the clip unit 24 with an adhesive layer 31 formed on the back of the clip unit. It is understood that the clip unit can be coupled to a variety of attachment adapters, as shown in FIG. 2, to enable attachment of the clip unit to a desired article.

Referring to FIG. 7, the clip unit 24 of the attachment system 20 uses magnetic force to attach the clip unit 24 to the main unit 12. The main unit 12 and the clip unit 24 are provided with magnets that are positioned in alignment with each other as described above. The clip lip 26 of the clip unit 24 slides into the main unit lip 14 of the main unit 12 and the main unit magnet 80 aligns with the clip magnet 50 to automatically engage the main unit 12 to the clip unit 24. As a result, the main unit 12 is securely attached to the clip unit 24. It is instructive to note the clip magnet 50 is shown in dotted shading to indicate it is provided inside the clip unit 24 and is not exposed at the external surface.

Figure 8:
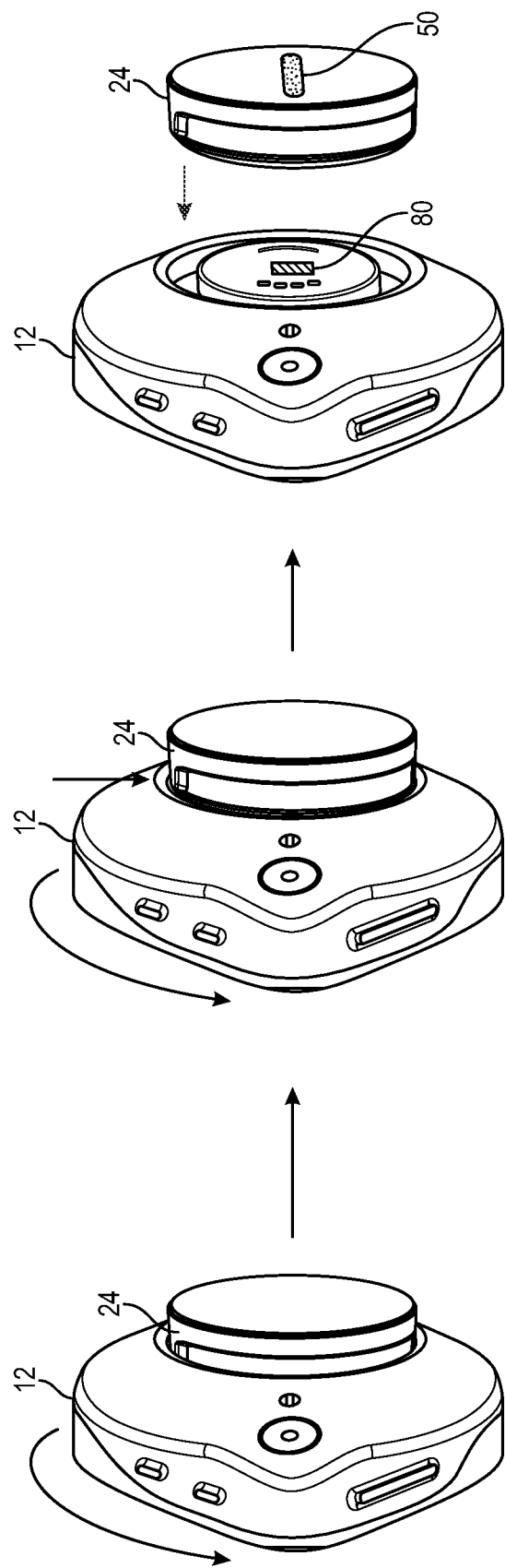
FIG. 8 illustrates the attachment mechanism for detaching the attachment system in embodiments of the present disclosure.

FIG. 7 illustrates the engagement, or clip on, of the main unit 12 to the clip unit 24. FIG. 8 illustrates the attachment mechanism for detaching the attachment system in embodiments of the present disclosure. In particular, FIG. 8 illustrates the disengagement, or clip off, of the main unit from the clip unit. Referring to FIG. 8, to disengage the main unit 12 from the clip unit 24, the main unit 12 is rotated to greater than N degrees (e.g., greater than 60°), in either the clockwise or counter-clockwise direction. As a result, the magnets on the main unit 12 and the clip unit 24 move out of alignment to automatically disengage the main unit 12 from the clip unit 24. The main unit 12 can then be removed from the clip unit 24 easily. In this manner, the attachment system in embodiments of the present invention enables a main unit to be removably attached to the clip unit for secure mounting and quick release. In some embodiments, the main unit 12 can be rotated from greater than 60° to greater than 90°. The exact amount of angular displacement for the main unit rotation is not critical to the practice of the present disclosure. It is instructive to note the clip magnet 50 is shown in dotted shading to indicate it is provided inside the clip unit 24 and is not exposed at the external surface.

Figure 9B:
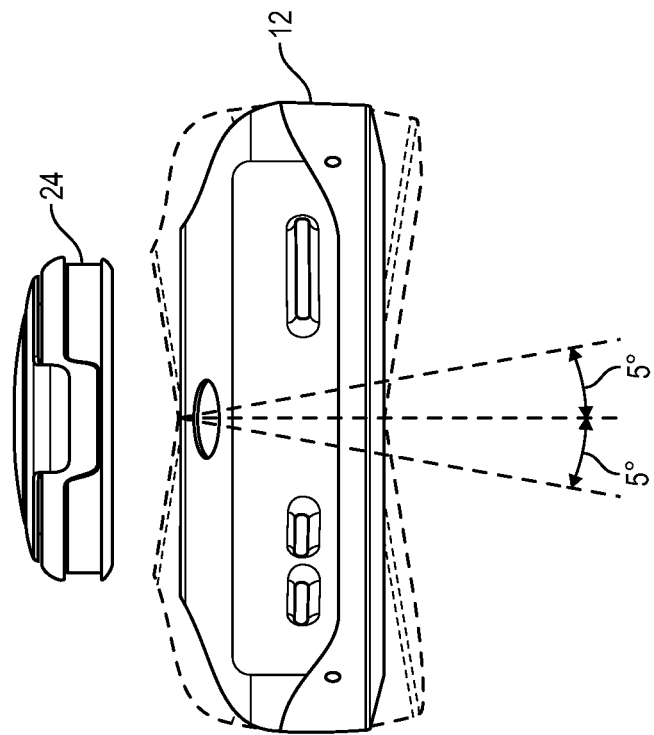
FIGS. 9(a) and 9(b), illustrates the engagement angle tolerance of the attachment system in some embodiments.
Figure 9A:
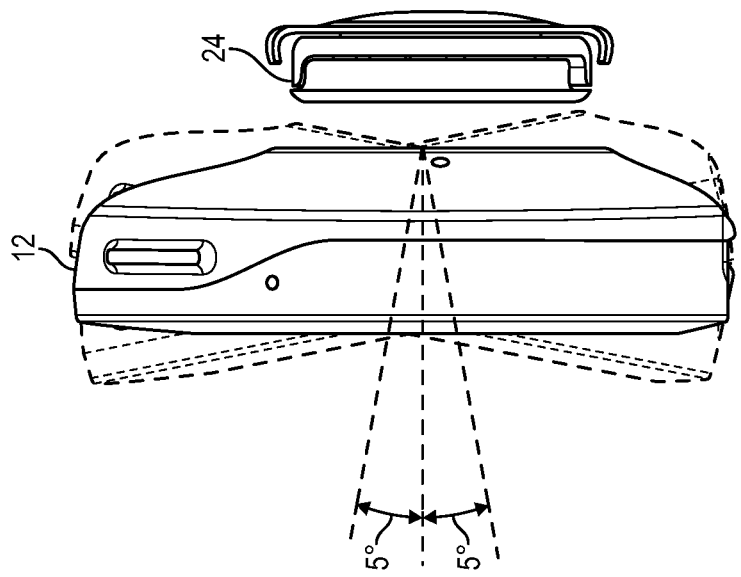

FIG. 9, which includes FIGS. 9(a) and 9(b), illustrates the engagement angle tolerance of the attachment system in some embodiments. Referring to FIG. 9(a), in some embodiments, the main unit 12 and the clip unit 24 can engage with a misalignment of as much as 5° from a rotational axis perpendicular to the front surface of the clip unit 24. Referring to FIG. 9(b), in some embodiments, the main unit 12 and the clip unit 24 can engage with a misalignment of as much as 5° from a rotational axis parallel to the front surface of the clip unit 24.

Figures 10, 10A, 10B, 10C:
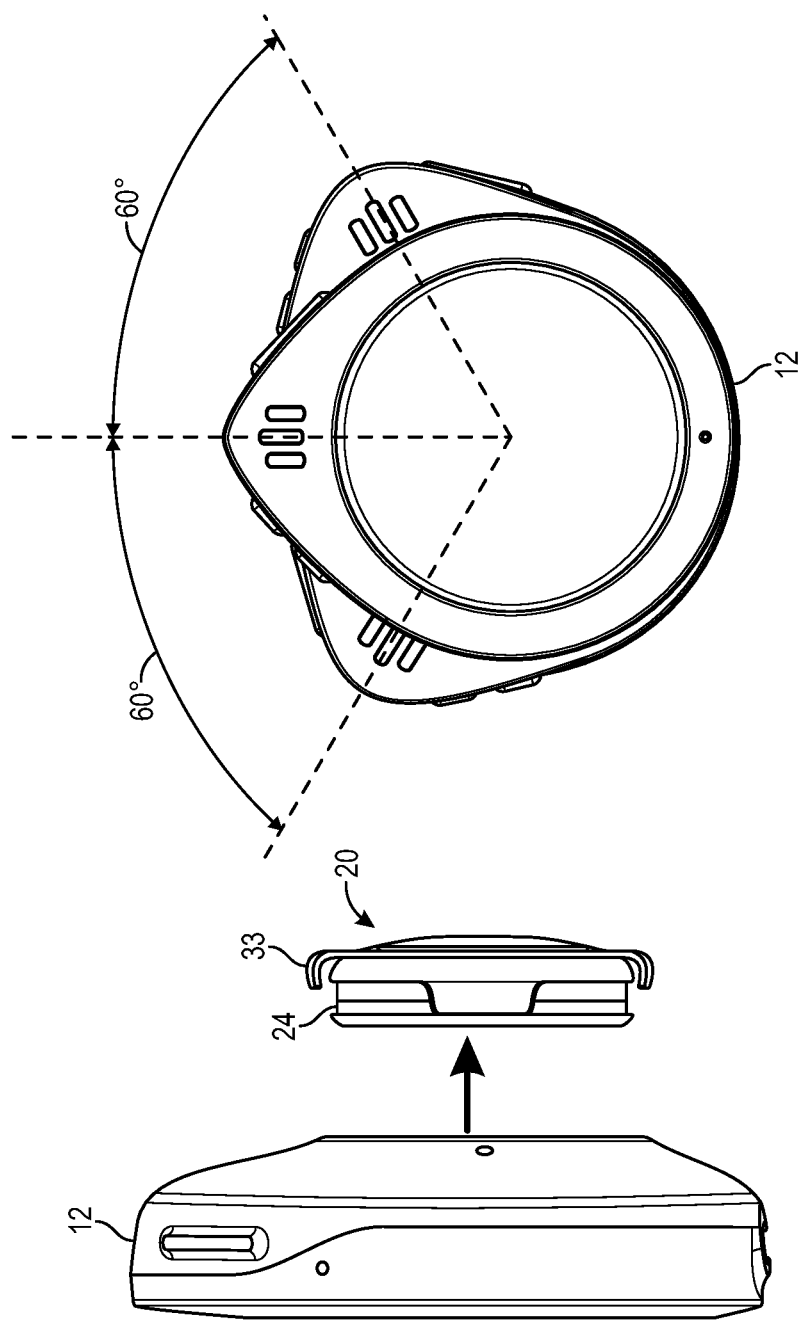
FIG. 10, which includes
FIGS. 10(a) to 10(c), illustrates the operation of the attachment system in some embodiments of the present invention.

FIG. 10, which includes FIGS. 10(a) to 10(c), illustrates the operation of the attachment system in some embodiments of the present invention. Referring to FIG. 10(a), when a main unit 12 is to be engaged with the clip unit, the engage force (or the clipping force) is set by the pull force magnets in the main unit 12 and the clip unit 24. For example, the pull force magnets are the main unit magnet 80 and the clip magnet 50 described above. In one embodiment, the main unit magnet and the clip magnet are 2 Kg pull force magnets. In the present description, "pull force" refers to the force when the clip unit 24 and main unit 24 are attached and fully engaged. In this configuration, the main unit 12 and the clip unit 24 have a 0 degree rotation between them and the magnets in both the clip unit 24 and the main unit 24 are parallel in orientation.

Referring to FIGS. 10(*b*) and 10(*c*), when the main unit 12 is rotated by N degrees, such as 60 degrees, relative to the clip unit 24, the main unit 12 disengages from the clip unit 24. The rotation can be in the clockwise or counter-clockwise direction. In some embodiments, the main unit 12 disengages from the clip unit 24 with less than 200 g of pull force along the rotation axis, the rotation axis being perpendicular to the front surface of the clip unit 24. By rotating the main unit 12, the main unit magnet 80 is no longer in alignment with the clip magnet 50 of the clip unit 24 and the main unit 12 is therefore no longer magnetically engaged with the clip unit 24 and can be removed readily.

In some examples, in an accident, the main unit 12 also disengage from the clip if exposed to a direct pull force of more than 35 Kg. Such disengagement would result in damages to the clip unit, but with the main unit surviving intact.

In this detailed description, various embodiments or examples of the present invention may be implemented in numerous ways, including as a process; an apparatus; a system; and/or a composition of matter.

A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. An attachment system for a portable electronic device, comprising:
   a clip unit comprising a clip magnet disposed between a base plate and a top cover and a clip lip having an undercut feature formed on the top cover; and
   an attachment adapter attached to a back side of the base plate and configured for attachment of the clip unit to an article,
   wherein the clip magnet is positioned in parallel alignment with a magnet in the portable electronic device, and in response to the clip unit being mated with the portable electronic device, the clip lip of the clip unit slides under a lip formed on the portable electronic device where the undercut feature of the clip lip engages with the lip formed on the portable electronic device in response to a pull force between the clip magnet and the magnet of the portable electronic device until the clip magnet and the magnet of the portable electronic device are aligned to lock the clip unit to the portable electronic device, wherein the clip lip slides along a direction parallel to a front surface of the clip unit.

2. The attachment system of claim 1, wherein the clip magnet is position with an offset relative to the magnet of the portable electronic device so that the clip lip is configured to slide under the lip formed on the portable electronic device along a direction parallel to the front surface of the clip unit when the clip unit is to be mated with the portable electronic device.

3. The attachment system of claim 1, wherein the clip magnet comprises a single-piece magnet or a set of magnets to provide the pull force to realize a secure mounting of the clip unit to the portable electronic device.

4. The attachment system of claim 1, wherein the attachment adapter comprises one of an adhesive layer, a helical ring, a bracket with an elastic band coupled thereto, a rotation lock unit and an arm band.

5. The attachment system of claim 1, wherein the attachment adapter comprises a helical ring including a metal winding having one and a half circle turn in a helical manner.

6. The attachment system of claim 1, wherein the base plate and the top cover are connected by a snap fit assembly.

7. The attachment system of claim 1, wherein in response to the clip unit being in contact with the portable electronic device, the undercut feature of the clip lip slides under with the lip formed on the portable electronic device and the lip formed on the portable electronic device slides under the clip lip, resulting in locking of the clip unit to the portable electronic device, wherein the clip lip slides along a direction parallel to the front surface of the clip unit.

8. The attachment system of claim 7, wherein the clip magnet aligns with the magnet in the portable electronic device to securely attached the clip unit to the portable electronic device.

9. The attachment system of claim 1, wherein in response to the clip unit being attached to the portable electronic device, the clip unit is released from the portable electronic device by rotation of the portable electronic device relative to the clip unit by at least N degree of angular displacement to cause the clip magnet and the magnet of the portable electronic device to move out of alignment.

10. The attachment system of claim 9, wherein the portable electronic device is rotated relative to the clip unit about a rotation axis perpendicular to a front surface of the clip unit.

11. The attachment system of claim 9, wherein the N degree of angular displacement comprising 60 degree.

12. The attachment system of claim 9, wherein the rotation comprises clockwise rotation or counter-clockwise rotation.

13. The attachment system of claim 9, wherein the clip magnet and the magnet in the portable electronic device have a pull force of a first value in response to the clip unit being mated with the portable electronic device to cause the clip unit and the portable electronic device to be attached and fully engaged; and the angular displacement of the clip unit relative to the portable electronic device as a result of the rotation reduces the pull force of the magnets to release the clip unit from the portable electronic device.

14. The attachment system of claim 13, wherein the angular displacement of the clip unit relative to the portable electronic device as the result of the rotation reduces the pull force of the magnets to 10% or less of the first value.

15. The attachment system of claim 14, wherein the pull force of the first value comprises 2 Kg of pull force and the angular displacement of the clip unit relative to the portable electronic device as the result of the rotation reduces the pull force of the magnets to 200 g.

16. An attachment system for a portable electronic device, comprising:
- a clip unit comprising a clip magnet disposed between a base plate and a top cover and a clip lip formed on the top cover; and
- an attachment adapter attached to a back side of the base plate and configured for attachment of the clip unit to an article,
- wherein the clip magnet is positioned to be aligned with a magnet in the portable electronic device in response to the clip unit being mated with the portable electronic device;
- wherein in response to the clip unit being attached to the portable electronic device, the clip unit is released from the portable electronic device by rotation of the portable electronic device relative to the clip unit by at least N degree of angular displacement; and
- wherein the clip magnet and the magnet in the portable electronic device have a pull force of a first value in response to the clip unit being mated with the portable electronic device to cause the clip unit and the portable electronic device to be attached and fully engaged; and the angular displacement of the clip unit relative to the portable electronic device as a result of the rotation reduces the pull force of the magnets to release the clip unit from the portable electronic device, the angular displacement of the clip unit relative to the portable electronic device as the result of the rotation reducing the pull force of the magnets to 10% or less of the first value.

17. The attachment system of claim 16, wherein the pull force of the first value comprises 2 Kg of pull force and the angular displacement of the clip unit relative to the portable electronic device as a result of the rotation reduces the pull force of the magnets to 200 g.

* * * * *